(12) United States Patent
Tailliet

(10) Patent No.: US 10,049,741 B2
(45) Date of Patent: Aug. 14, 2018

(54) NON-VOLATILE MEMORY WITH FLOATING GATE HAVING PROTRUDING PORTION

(71) Applicant: STMicroelectronics (Rousset) SAS, Rousset (FR)

(72) Inventor: François Tailliet, Fuveau (FR)

(73) Assignee: STMICROELECTRONICS (ROUSSET) SAS, Rousset (FR)

( * ) Notice: Subject to any disclaimer, the term of this patent is extended or adjusted under 35 U.S.C. 154(b) by 0 days.

(21) Appl. No.: 15/436,829

(22) Filed: Feb. 19, 2017

(65) Prior Publication Data

US 2018/0033487 A1   Feb. 1, 2018

(30) Foreign Application Priority Data

Jul. 27, 2016   (FR) ..................... 16 57225

(51) Int. Cl.
| | |
|---|---|
| *G11C 16/04* | (2006.01) |
| *H01L 27/11519* | (2017.01) |
| *H01L 27/11521* | (2017.01) |
| *H01L 27/11526* | (2017.01) |
| *H01L 27/11556* | (2017.01) |
| *G11C 16/14* | (2006.01) |
| *G11C 16/12* | (2006.01) |
| *H01L 29/423* | (2006.01) |

(52) U.S. Cl.
CPC ......... *G11C 16/0433* (2013.01); *G11C 16/12* (2013.01); *G11C 16/14* (2013.01); *H01L 27/11519* (2013.01); *H01L 27/11521* (2013.01); *H01L 27/11526* (2013.01); *H01L 27/11556* (2013.01); *H01L 29/42324* (2013.01)

(58) Field of Classification Search
CPC ............ G11C 16/0425; G11C 16/0483; G11C 16/0433; G11C 16/12; G11C 16/14; G11C 16/0416
USPC ....... 365/63, 185.29, 185.22, 185.17, 185.18
See application file for complete search history.

(56) References Cited

U.S. PATENT DOCUMENTS

| | | | |
|---|---|---|---|
| 5,273,926 | A | 12/1993 | Tigelaar |
| 5,429,969 | A | 7/1995 | Chang |
| 5,621,233 | A | 4/1997 | Sharma et al. |
| 6,362,047 | B1 | 3/2002 | Ventajol |
| 7,268,387 | B2 | 9/2007 | Kurokawa et al. |
| 8,792,262 | B2 | 7/2014 | Tailliet |

(Continued)

FOREIGN PATENT DOCUMENTS

| | | |
|---|---|---|
| EP | 1094510 A1 | 4/2001 |
| EP | 1107317 A1 | 6/2001 |

(Continued)

*Primary Examiner* — Gene Auduong
(74) *Attorney, Agent, or Firm* — Slater Matsil, LLP

(57) ABSTRACT

A memory cell includes a source region and a drain region disposed in a semiconductor body. A channel region is disposed in the semiconductor body between the source region and the drain region. A floating gate is disposed between the semiconductor body and the control gate. The floating gate includes a protruding portion that is located over the channel region between the source and drain regions and spaced therefrom. The protruding portion is separated from the channel region by a first insulating layer that is thinner than a second insulating layer that separates remaining portions of the floating gate from the channel region.

24 Claims, 12 Drawing Sheets

(56) References Cited

U.S. PATENT DOCUMENTS

| | | |
|---|---|---|
| 2003/0035329 A1 | 2/2003 | Tailliet et al. |
| 2004/0119110 A1* | 6/2004 | Park .................. H01L 21/28273 |
| | | 257/315 |
| 2006/0027859 A1* | 2/2006 | Lee .................... H01L 21/28273 |
| | | 257/315 |
| 2012/0243339 A1* | 9/2012 | Seo .................... G11C 16/0425 |
| | | 365/185.29 |
| 2016/0141032 A1 | 5/2016 | Tailliet |
| 2016/0155506 A1 | 6/2016 | Tailliet |

FOREIGN PATENT DOCUMENTS

| | | |
|---|---|---|
| FR | 2987697 A1 | 9/2013 |
| JP | H0897302 A | 4/1996 |
| JP | H10189781 A | 7/1998 |

\* cited by examiner

FIG.11

Erasing

| Column | Row | Datum | BL (V) | WL (V) | CG (V) | PSUB (V) | SL (V) | BL-CG (V) | Result |
|---|---|---|---|---|---|---|---|---|---|
| Not select | Not select | 0 | 0 | 0 | -2 | 0 | 0 | 2 | No disturbance |
| Not select | Selected | 0 | 0 | 0 | -2 | 0 | 0 | 2 | No disturbance |
| Selected | Not select | 0 | 0 | 0 | -2 | 0 | 0 | 2 | No disturbance |
| Selected | Sélectionnée | 0 | 0 | 0 | -13 | 0 | 0 | 13 | Erased |

Programming

| Column | Row | Datum | BL (V) | WL (V) | CG (V) | PSUB (V) | SL (V) | BL-CG (V) | Result |
|---|---|---|---|---|---|---|---|---|---|
| Not select | Not select | x | 0 | 0 | 2 | 0 | 0 | -2 | No disturbance |
| Not select | Selected | x | 0 | 0 | 2 | 0 | 0 | -2 | No disturbance |
| Selected | Not select | 0 | 0 | 0 | 2 | 0 | 0 | -2 | No disturbance |
| Selected | Selected | 0 | 7 | 0 | 13 | 0 | 0 | -6 | Fewer disturbances |
| Selected | Selected | 1 | 0 | 0 | 13 | 0 | 0 | -13 | Programmed |

Reading out

| Column | Row | Datum | BL (V) | WL (V) | CG (V) | PSUB (V) | SL (V) | BL-CG (V) | Result |
|---|---|---|---|---|---|---|---|---|---|
| Not select | Not select | x | floating | 0 | 0 | 0 | 0 | <1 | No disturbance |
| Not select | Selected | x | 0 or float | Vdd | CGread | 0 | 0 | <1 | No disturbance |
| Selected | Not select | 0 | floating | 0 | CGread | 0 | 0 | <1 | No disturbance |
| Selected | Selected | 0 | Vhigh | Vdd | -CGread | 0 | 0 | <1 | No disturbance |

NON-VOLATILE MEMORY WITH FLOATING GATE HAVING PROTRUDING PORTION

CROSS-REFERENCE TO RELATED APPLICATIONS

This application claims priority to French Patent Application No. 1657225, filed on Jul. 27, 2016, which application is hereby incorporated herein by reference.

TECHNICAL FIELD

Embodiments and modes of implementation of the invention relate to memories and, in particular, to electrically erasable and programmable non-volatile memories (EEPROM).

BACKGROUND

In the EEPROM memories, the logic value of a logic datum, or bit, stored in a memory cell is represented by an off or on state of the memory cell and more precisely by the value of the threshold voltage of a floating-gate transistor called the state transistor.

The on or off states of a memory cell may be modified at will in a write cycle generally comprising an erasing operation followed by a programming operation, implementing high write voltages.

FIG. 1 shows a cross-sectional view of a conventional EEPROM memory cell CEL0 and FIG. 2 shows a circuit diagram of such a memory cell CEL0.

Conventionally, memory cells are arranged in matrix arrays of rows (in the X direction) and columns (in the Y direction) in a memory plane PM.

The memory cell CEL0 includes a floating-gate transistor TE0, called the state transistor, and an access or selection transistor TA0 that is connected in series between the drain D of the state transistor TE0 and a bit line BL extending in the Y direction of the columns of the memory plane.

A tunnel injection zone INJT is conventionally formed on drain side of the state transistor TE0, above an implanted zone CAP currently designated by the term "capa implant" in the art.

The "capa implant" zone is especially intended to distance the tunnel injection zone INJT from the drain-channel junction of the state transistor.

The tunnel injection zone INJT includes a tunnel oxide OXTN that is thinner than a high-voltage gate oxide OXHV covering the channel of the state transistor TE0.

The source S of the state transistor TE0 is connected to a source line SL extending in the X direction of the rows of the memory plane, orthogonally to the Y direction.

An erase is carried out by applying a high positive voltage, for example 14 V, to the control gate CG0 of a state transistor TE0 and a for example zero voltage to its drain D, in order to inject electrical charges from the drain D into the floating gate FG via the Fowler-Nordheim effect.

The conventional programming operation aims, for its part, to apply selective stimuli to selected memory cells in order to place them in an on state.

Programming is carried out by applying a zero voltage to the control gate CG0 of the state transistor TE0 and a high positive voltage, for example 13 V, to its drain D, in order to extract the electric charges from the floating gate FG to the drain D, also by the Fowler-Nordheim effect.

The high positive voltage is transmitted from the bit line BL to the drain D via the selection transistor TA0, which is turned on by a voltage, for example 16 V, applied to its gate.

The usual approach used up to now with the aim of meeting the continual need to decrease the size of memory cells without degrading their endurance and data-retention performance and their performance in terms of parasitic signals has reached a technological limit.

Specifically, the decrease in the size of a memory cell is limited in the column direction, especially for the following reasons: since the selection transistor is a high-voltage transistor, decreasing its length runs the risk of causing leakage in the off state and/or of decreasing its maximum operating voltage; decreasing the length of the state transistor runs the risk of causing leakage in the off state and therefore of penalizing read-out; and decreasing the tunnel injection area would decrease the endurance of the cell.

Furthermore, decreasing the overrun of the "capa implant" zone would bring the tunnel injection zone closer to the drain-channel junction of the state transistor, and would run the risk of causing "band-to-band" leakage, resulting in an increase in programming current and increasing endurance.

Furthermore, the decrease in the size of a memory cell is also limited in the row direction, especially because of the influence of the state of the memory plane on the behavior of a memory cell (for example, the influence of neighboring memory cells or cells belonging to the same bit line). Such an influence is usually designated by those skilled in the art by the term "disturbance" or "disturb."

A programming disturbance may manifest itself as a gradual variation in the charge on an unaddressed memory cell, i.e., unaddressed in the parasitic programming sense of the term.

During read-out, a disturbance may take the form of a disruption of the on/off state of a cell observed by the read-out amplifiers.

Decreasing coupling factor may lead to a decrease in the variation in the threshold voltage between the erased and programmed states.

An approach called the split-voltage approach has previously allowed these limits to be overcome while preserving the basic architecture of an EEPROM memory cell.

For example, during programming operations, the voltage on the control gate is no longer 0 V but –7 V and the voltage on the drain of the state transistor is no longer 13 V but 6 V.

However, the split-voltage approach is also reaching a limit as regards decreasing size without adversely affecting performance, especially because of the conventional memory-cell architecture employed in this approach.

SUMMARY

For this reason, according to one embodiment, an architecture is provided for an EEPROM memory device that is more compact but performs no worse.

According to one aspect, an electrically erasable and programmable nonvolatile memory device is provided. The device comprises at least one memory cell including a state transistor having source and drain regions. These regions are formed in a semiconductor substrate. A channel region is formed between the source and drain and facing where there is a floating gate that is surmounted by a control gate. The floating gate includes a protruding portion that is located above the channel region, between the source region and drain regions and at distance from these regions (i.e., the perimeter of the protruding portion is a distance away from the perimeter of these regions), and separated from the channel region by a first oxide, typically a tunnel oxide, that is thinner than a second oxide, typically a high-voltage gate oxide, separating the rest of the floating gate from the channel region.

Those portions of the floating gate and channel region which are located on either side of the tunnel oxide form a tunnel injection zone, in which the Fowler Nordheim effect is implemented.

This protruding portion is preferably centered in the middle of the channel region, the protruding portion advantageously being laterally insulated from the source and drain regions by the high-voltage gate oxide.

Thus, with such an architecture, a logic datum is written to a memory cell by extracting and/or injecting charge from/into the floating gate of the state transistor of the memory cell via the Fowler Nordheim effect in the tunnel injection zone, i.e., the zone between the channel region and the protruding portion, through the tunnel oxide.

This architecture especially makes it possible to remove the zone called the "capa implant" zone, the implantation of which, since it is carried out before the deposition of the polysilicon layers, is not self-aligned with the gates. This absence of "capa implant" zone makes one mask redundant in the process for fabricating the memory cell, and allows space to be saved in the Y dimension of the memory cell.

Thus, this architecture allows an injection area and an effective channel length to be guaranteed independently of mask misalignment.

In particular, the tunnel injection zone is located a distance away from the source and drain regions of the state transistor, which regions are "bordered" by high-voltage gate oxide, preventing hot-carrier injection at the edge of the source and drain regions.

However, the injection and extraction of charge are controlled by the potential difference between the floating gate and the channel zone located level with the tunnel injection zone.

For this potential to be controlled by the bit-line voltage in the programming phase requires the state transistor to be turned on.

However, the control gates of the state transistors of a given memory word are conventionally connected together, this especially enabling an advantageous space saving but preventing selection via the control gates.

It is nevertheless possible to extract charge from the floating gate to the channel region, or more generally in this case to the substrate.

For this reason, according to one embodiment in which the device comprises a memory plane that is arranged in a matrix array of rows and columns of memory cells, the rows being divided into memory words of a plurality of memory cells, the device comprises erase circuitry that is configured to erase a memory word by way of a collective erasing operation that turns on all the memory cells of the memory word.

Advantageously, the erase circuit is configured to apply a negative erasing pulse to the control gates of the state transistors of the memory cells of the memory word and a zero voltage to the channel region of the state transistors.

Applying a negative erasing pulse to the common control gate of the cells of a given memory word places the channel zone of each cell of the word into the accumulation regime, i.e., at the potential of the substrate, the substrate typically being p-type and at a zero ground potential.

Each floating gate of the memory word is placed at a very negative potential by capacitive coupling with the control gate and therefore charge is extracted from each floating gate to the potential of the channel.

As the channel region cannot be inverted by selectively stimulating memory cells via their control gates, the programming is advantageously collective and comprises selectively inhibiting, via the bit lines, memory cells that must not be programmed.

Thus, according to one embodiment, the device comprises a programming circuit configured to program a memory word by applying a programming pulse to the control gates of the state transistors of all the memory cells of the memory word, while inhibiting the programming of those memory cells of the memory word which must not be programmed, in order to place the memory cells to be programmed in an off state and not to place the memory cells that must not be programmed in an off state.

Thus, the programming circuit is advantageously configured to apply, by way of programming pulse, a positive voltage that is sufficient to invert the channel regions of the state transistors of the memory cells, to apply a zero voltage to the channel regions of the state transistors of the memory cells to be programmed, and to apply the inhibiting voltage, which is positive and lower than the programming voltage, via the drain of the state transistors of the memory cells that must not be programmed.

In other words, during the programming, the control gates common to all the cells of a given word are advantageously brought to a high potential, this also bringing the floating gates of the memory cells to a high potential. The state transistors are placed in an on state.

The injection of charge into the floating gate depends on the potential of the channel in the tunnel injection zone, which potential is equal to the potential of the bit line to which the memory cell belongs. A low potential, for example a zero potential, allows this injection, whereas a high potential inhibits this injection.

Whether or not any of the cells of a given word are programmed is therefore controlled by the potential of the bit lines to which the cells belong.

According to one embodiment, each memory cell includes a selection structure that is able to electrically isolate from, or connect to, a source line the source region of the state transistor of this memory cell.

According to one embodiment that is advantageously compatible with existing technological approaches, the control gate of the state transistor includes a lateral portion that extends beyond the lateral ends of the floating gate and covers a portion of the channel region, and the selection structure comprises the lateral portion of the control gate.

Here, because of the overlap with a portion of the channel region, the control gate here also plays the role of planar access transistor. The access transistor especially allows a row to be selected during read-out.

During a programming cycle, the drains of the cells of a given memory word are at different potentials (depending on whether the memory cell is to be programmed or to be inhibited). As the transistors are in the on state, the sources of the state transistors are also at different potentials. To prevent a short-circuit through the source line between cells of a given memory word, the source of the state transistor would advantageously be isolated from the source line by a turned-off selection transistor.

However, in this approach it is impossible to isolate the potential of the source during programming since the control gate of the state transistor, here also forming the gate of the access transistor, is at high potential. It is therefore necessary for the cells of a given memory word to have a separate source line to prevent short-circuits.

Therefore, each cell must include two individual lines running in the column direction: a bit line and a source line. It is difficult to fit these two lines in the width of a memory cell and for this reason pairs of memory cells containing one bit are advantageously connected in parallel, the cells sharing the same bit line and the same source line. These two lines then have enough space as they run over a pair of memory cells.

Thus, according to this embodiment, the device comprising a memory plane that is arranged in a matrix array of rows and columns of memory cells, a logic datum is intended to be written to two connected memory cells each including a state transistor, the sources of the cells being electrically connected to each other by a source metal track and the drains of the cells being electrically connected to each other by a drain metal track, the source line comprising a metal track extending in the direction of the columns of the memory plane above one of the two state transistors and being connected, above the source of this state transistor, by a via to the source metal track, and wherein a bit line comprising a metal track extends in the direction of the columns of the memory plane above the other of the two state transistors and is connected, above the drain of this other state transistor, by a via to the drain metal track.

Since this configuration ensures data redundancy, it allows errors to be corrected without the drawbacks of error correcting codes the implementing structures that generally occupy a large area.

According to one embodiment, the selection structure includes a planar transistor that is connected in series between the source of the state transistor and the source line.

This embodiment makes it possible to produce a state transistor that is more compact.

The access transistor allows a row to be selected during read-out and the inhibiting voltage to be isolated from the source line, thus allowing the source line to be common to all the memory cells of the row.

According to one embodiment, the selection structure includes a vertical-gate transistor connected in series between the source of the state transistor and a source line that is formed by a doped semiconductor region buried in the semiconductor substrate, the buried semiconductor region also forming the source of the vertical-gate transistor.

This embodiment is in particular particularly advantageous in terms of the size of a memory cell.

According to one embodiment, the width of the protruding portion of the floating gate, as measured in the source-drain direction, represents, to within 10%, one quarter of the width of the floating gate.

A method is furthermore provided for writing logic data in a nonvolatile memory device such as defined above including a memory plane arranged in a matrix array of rows and columns of memory cells, the rows being divided into memory words of a plurality of memory cells, the method comprising an erasing step in which all the memory cells of a memory word are turned on, and a programming step in which, where appropriate, the memory cells of the memory word not to be programmed are selected and all the other memory cells of the memory word are turned off, thus programming them.

BRIEF DESCRIPTION OF THE DRAWINGS

Other advantages and features of the invention will become clear on examining the detailed description of completely non-limiting embodiments and modes of implementation, and the appended drawings, in which:

FIGS. 3 to 12 illustrate various embodiments and modes of implementation of the invention.

DETAILED DESCRIPTION OF ILLUSTRATIVE EMBODIMENTS

In the various figures, which are described in detail below, elements common to the various embodiments are designated by the same references and are not systematically detailed for each thereof.

Figure 3:
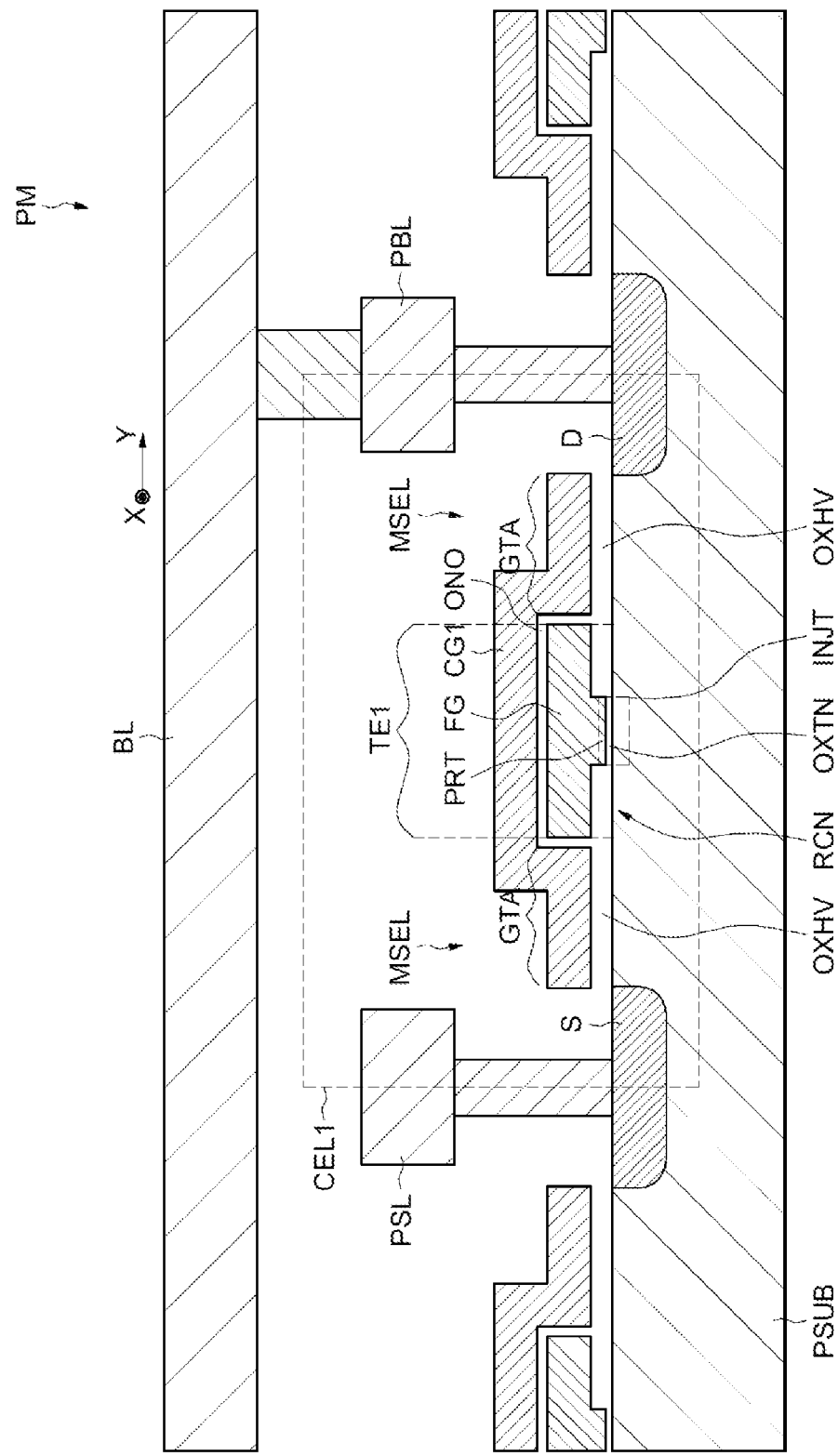
Figure 4:
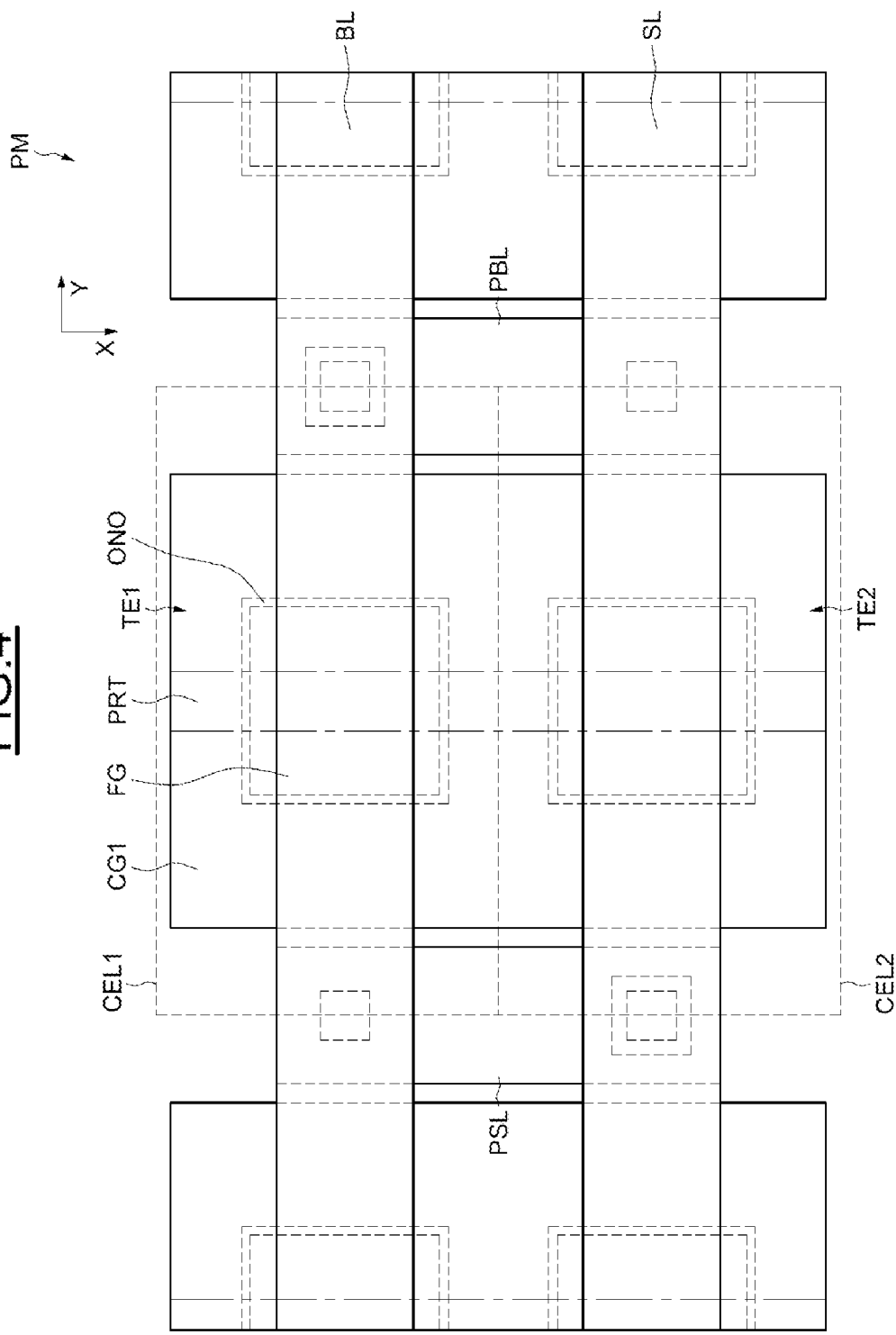
Figure 5:
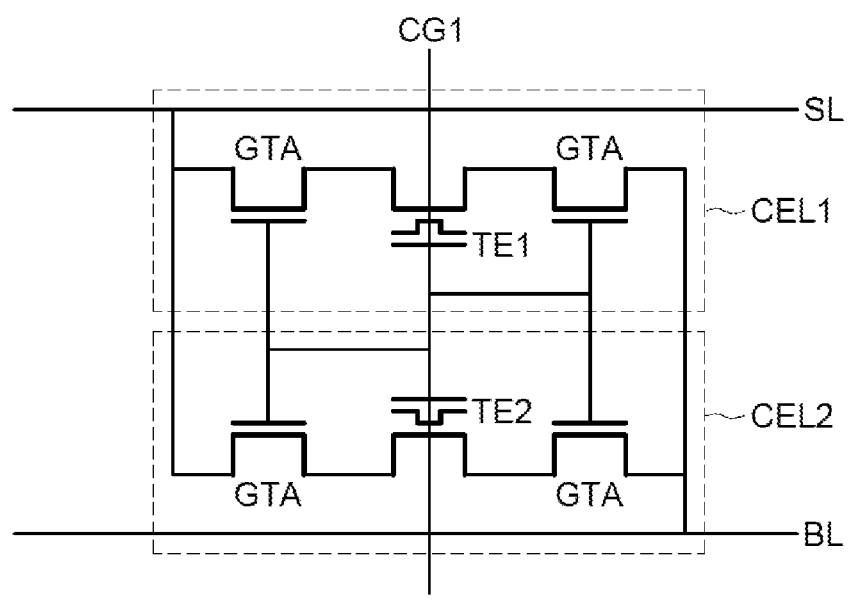

FIGS. 3, 4 and 5 respectively show a cross-sectional view, a top view and a circuit diagram of a memory cell CEL1 according to one embodiment of an EEPROM memory.

The memory cell CEL1 includes a state transistor TE1 comprising a control gate CG1 and a floating gate FG.

The control gate CG1 includes lateral portions GTA, called access portions, that extend beyond the lateral ends of the floating gate FG.

The portions GTA constitute a selection structure MSEL the equivalent of two access transistors placed in series with the state transistor TE1 and perform the function of a selection transistor MSEL.

The selection transistor structure MSEL allows the state transistor TE1 to be connected to a source region S and to a drain region D, which are for example $n^+$-type and formed in a p-type semiconductor substrate PSUB.

The source and drain regions are respectively connected to a source line SL and to a bit line BL, both of which extend in the Y direction of the columns of the memory plane.

A channel region RCN is located at the surface of the substrate PSUB, between the source region S and the drain region D. The expression "channel region" is used in a non-standard manner here and below to designate the region in which the conduction channel of a turned-on transistor forms.

A floating gate FG, generally formed from polysilicon and insulated from the channel region RCN by dielectric layers OXHV, OXTN, which are generally made of silicon oxide, is located above the channel region RCN.

The dielectric layers include a tunnel oxide layer OXTN covering the channel region and a high-voltage gate oxide layer OXHV, which is thicker than the tunnel oxide, covering the source and drain sides of the channel region, the oxides forming therebetween a "step" that is the same thickness as the tunnel oxide.

The floating gate FG thus includes a protrusion, or protruding portion, PRT that is directed towards the channel region RCN and located in the step between the high-voltage gate oxide layers, substantially in the middle of the width of the floating gate FG, and that extends longitudinally in the X direction of the rows of the memory plane.

By way of indication, the width of the protruding portion PRT, measured in the source-drain direction, i.e., in the Y direction, may be 0.1 μm whereas the portions of the floating gate FG facing the high-voltage gate oxides OXHV on the source and drain side may have a width of 0.16 μm.

The floating gate FG is furthermore surmounted by the control gate CG1, which is generally also made from polysilicon, and the gates are insulated from each other by another dielectric layer ONO that is for example an oxide-nitride-oxide stack.

Figure 1:
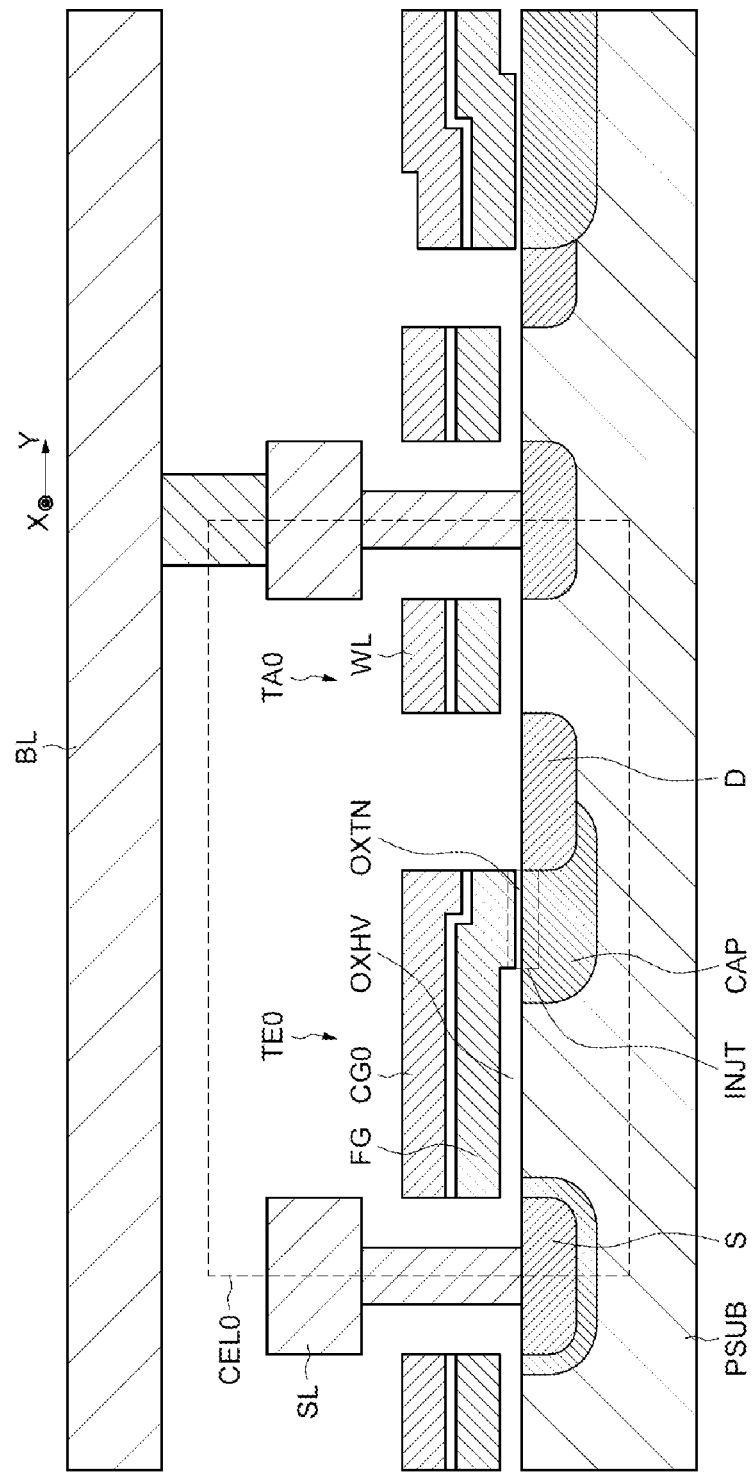
FIGS. 1 and 2, which have already been described, illustrate a prior-art EEPROM memory cell.
Figure 2:
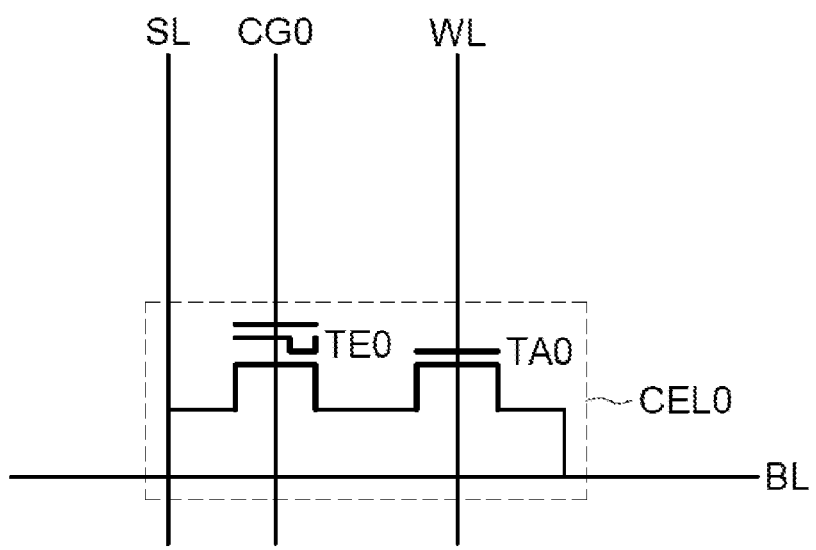

The source line SL and the bit line BL are for example formed by metal tracks extending in the Y direction of the columns of the memory plane PM (FIGS. 2 and 3).

Therefore, for a given memory cell, two metal tracks should extend in the Y direction of the columns of the memory plane.

Thus, as illustrated in FIGS. 2 and 3, this embodiment makes provision for two parallel-connected memory cells CEL1, CEL2 to store one bit.

Specifically, the respective source regions of the two memory cells CEL1, CEL2 are connected by small metal tracks PSL, and the respective drain regions of the two memory cells CEL1, CEL2 are connected by small metal tracks PBL. The two state transistors TE1, TE2 also share the same control gate CG1, but have separate floating gates FG1, FG2.

The source line SL passes above the memory cell CEL2 and is connected to the small metal track PSL, which is common to the memory cells CEL1 and CEL2, by a via located above the source region of the memory cell CEL2.

Likewise, the bit line BL passes above the memory cell CEL1 and is connected to the small metal track PBL, which is common to the two memory cells CEL1 and CEL2, by a via located above the drain region of the memory cell CEL1.

Therefore, and as detailed below, a logic datum is written both to the memory cell CEL1 and to the memory cell CEL2.

This data redundancy for example allows the risk of retention errors to be limited and potentially makes it possible not to use conventional error-correcting code circuits, which generally occupy a large area.

By way of indication, in this embodiment the area occupied by a memory cell may be 0.38 $\mu m^2$.

Furthermore, with a 14 nm-thick dielectric ONO between the gates FG and CG, a 22 nm-thick high-voltage gate oxide OXHV, a 7.5 nm-thick tunnel oxide and a 0.1 $\mu m$-thick floating gate FG a coupling factor of 75 to 80% is obtained.

Figure 6:
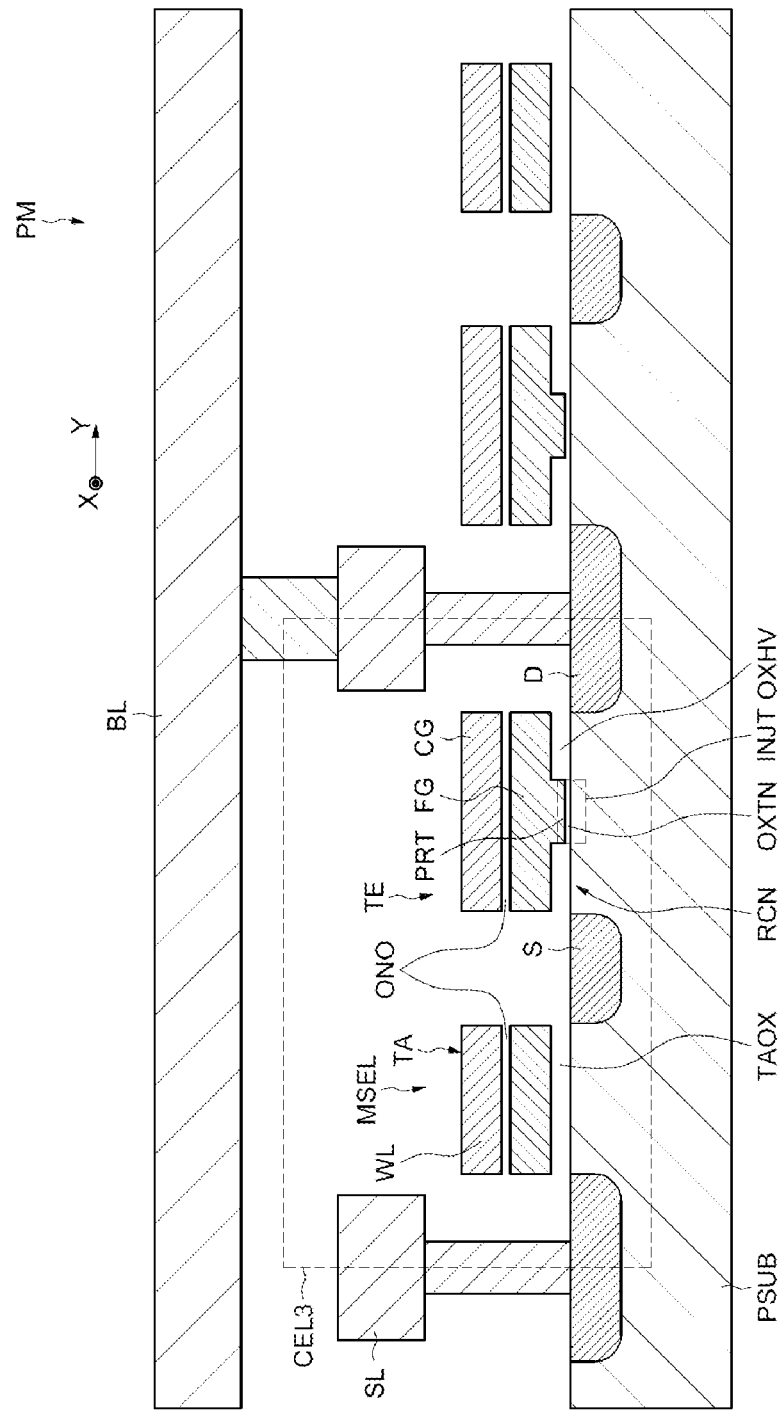
Figure 7:
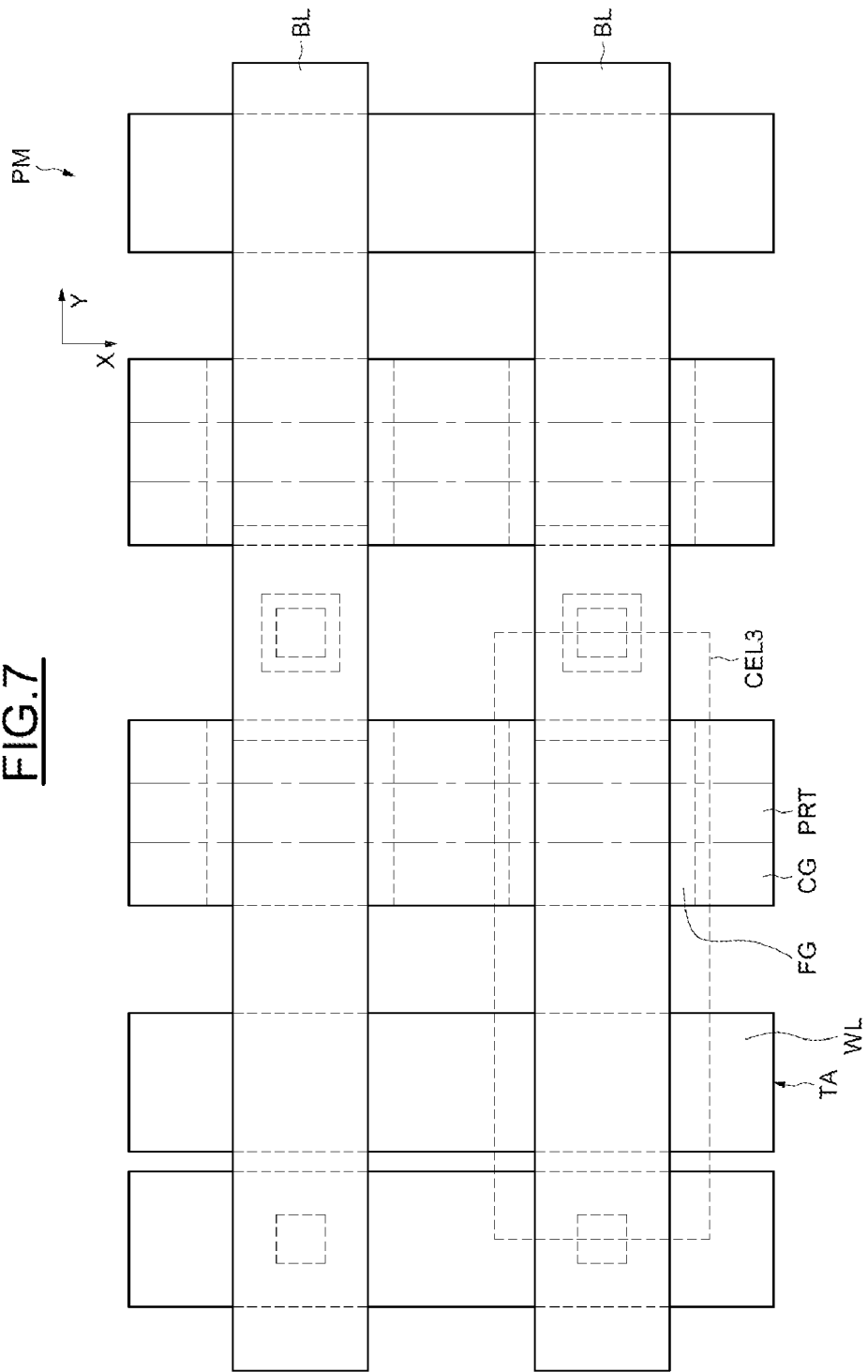
Figure 8:
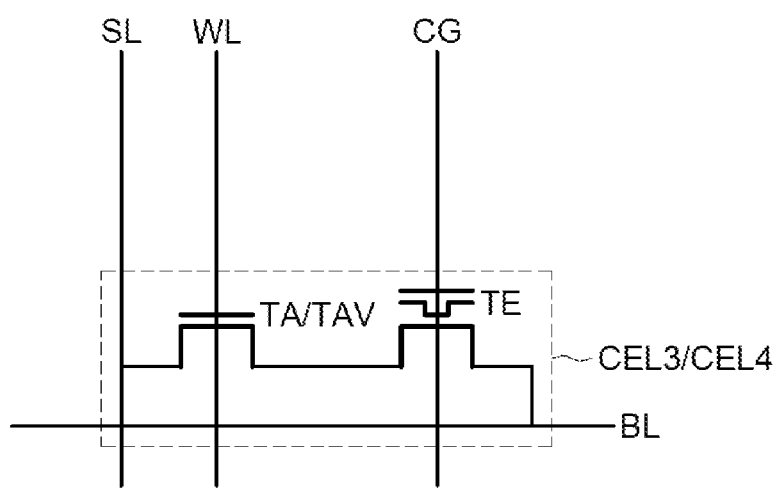

FIGS. 6, 7 and 8 respectively show a cross-sectional view, a top view and a circuit diagram of a memory cell CEL3 according to another embodiment of an EEPROM memory.

The memory cell CEL3 includes an access transistor TA and a state transistor TE, the state transistor comprising a source region S and a drain region D, which regions are formed in a semiconductor substrate PSUB.

The access transistor TA forms a selecting structure MSEL and, in this embodiment, is structurally analogous to a floating-gate transistor, except for the fact that the two gates are connected together in order to obtain the behavior of a planar transistor. The short-circuit connecting the two gates is for example produced out of the plane of the cross section and is therefore not shown.

The drain region of the access transistor TA is common to the source region S of the state transistor TE, and the source region of the transistor TA is electrically connected to a source line SL.

In other words, the access transistor TA is connected in series between the source S of the state transistor TE and a source line SL.

The access transistors TA of a given word line are controlled by a voltage present on a common word line WL.

In FIG. 6, although it is not drawn to scale, the thickness of the gate oxide TAOX separating the gate TAG from the channel region TACN of the access transistor TA is substantially the same as the thickness of the high-voltage gate oxide OXHV of the state transistor TE.

However, it may be advantageous for the gate oxide TAOX of the access transistor TA to be as thin as the tunnel oxide OXTN, in order to significantly decrease the length of the channel of the transistor TA, the channel region TACN then advantageously being more highly doped.

The state transistor TE also includes a channel region RCN, covered by layers of high-voltage gate oxide OXHV and tunnel oxide OXTN of different thicknesses and forming a step located at the center of the length of the channel.

Each of those portions of the floating gate and channel region which are located vertically facing the tunnel oxide also form the tunnel injection zone INJT, in which zone the Fowler-Nordheim effect is implemented.

The floating gate FG is also surmounted by a control gate CG, but does not comprise an access portion extending beyond the lateral ends of the floating gate FG.

The width of the control gate CG of the state transistor of a memory cell in this embodiment is conventionally substantially equal to the width of the floating gate FG, which itself is substantially equal to the length of the channel.

In this embodiment, a memory cell CEL3 stores one bit and the area occupied by such a memory cell may be 0.32 $\mu m^2$ if the gate oxide of the access transistor TA is of high-voltage-gate-oxide thickness, and 0.29 $\mu m^2$ if it is of tunnel-oxide thickness.

Figure 9:
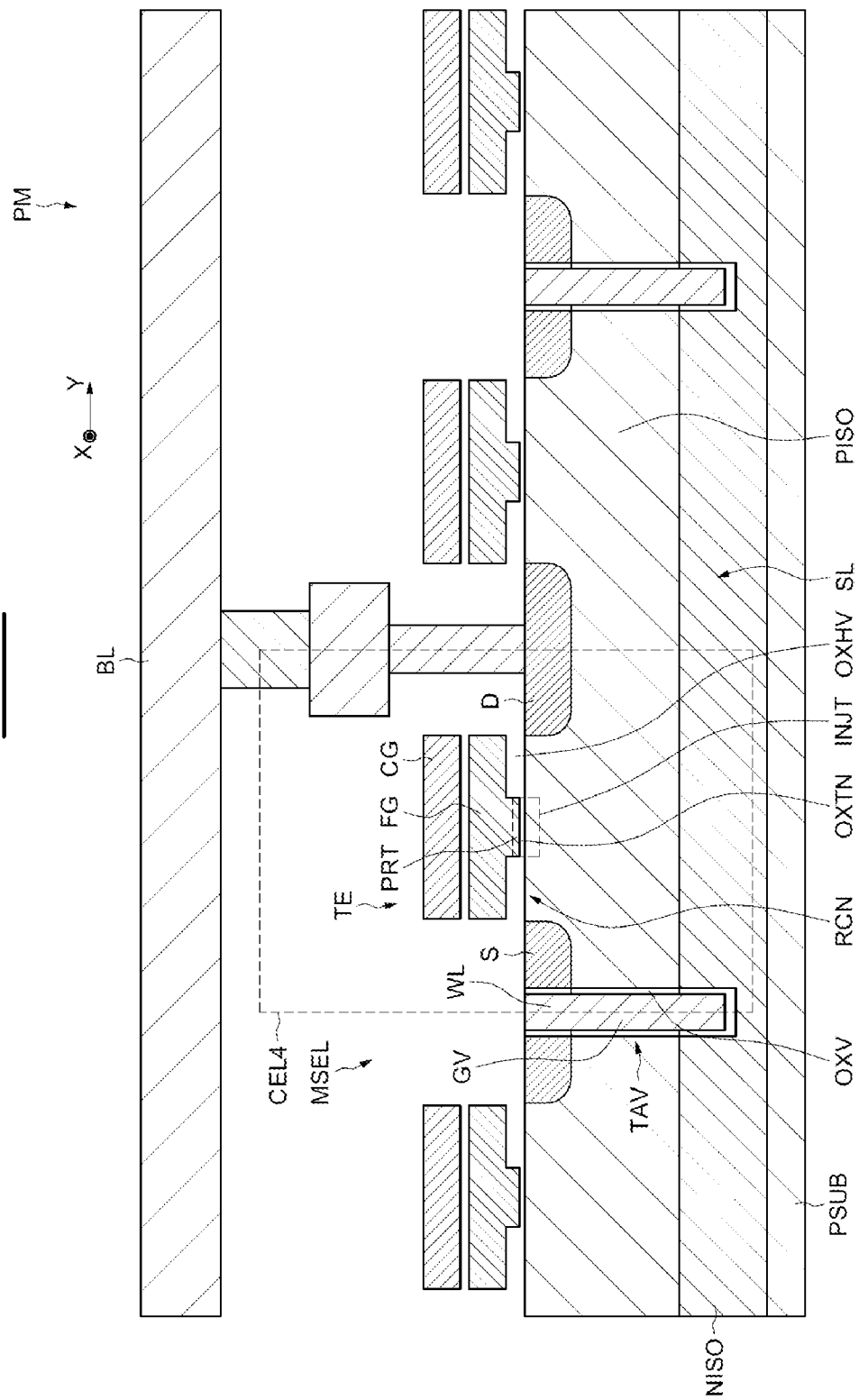
Figure 10:
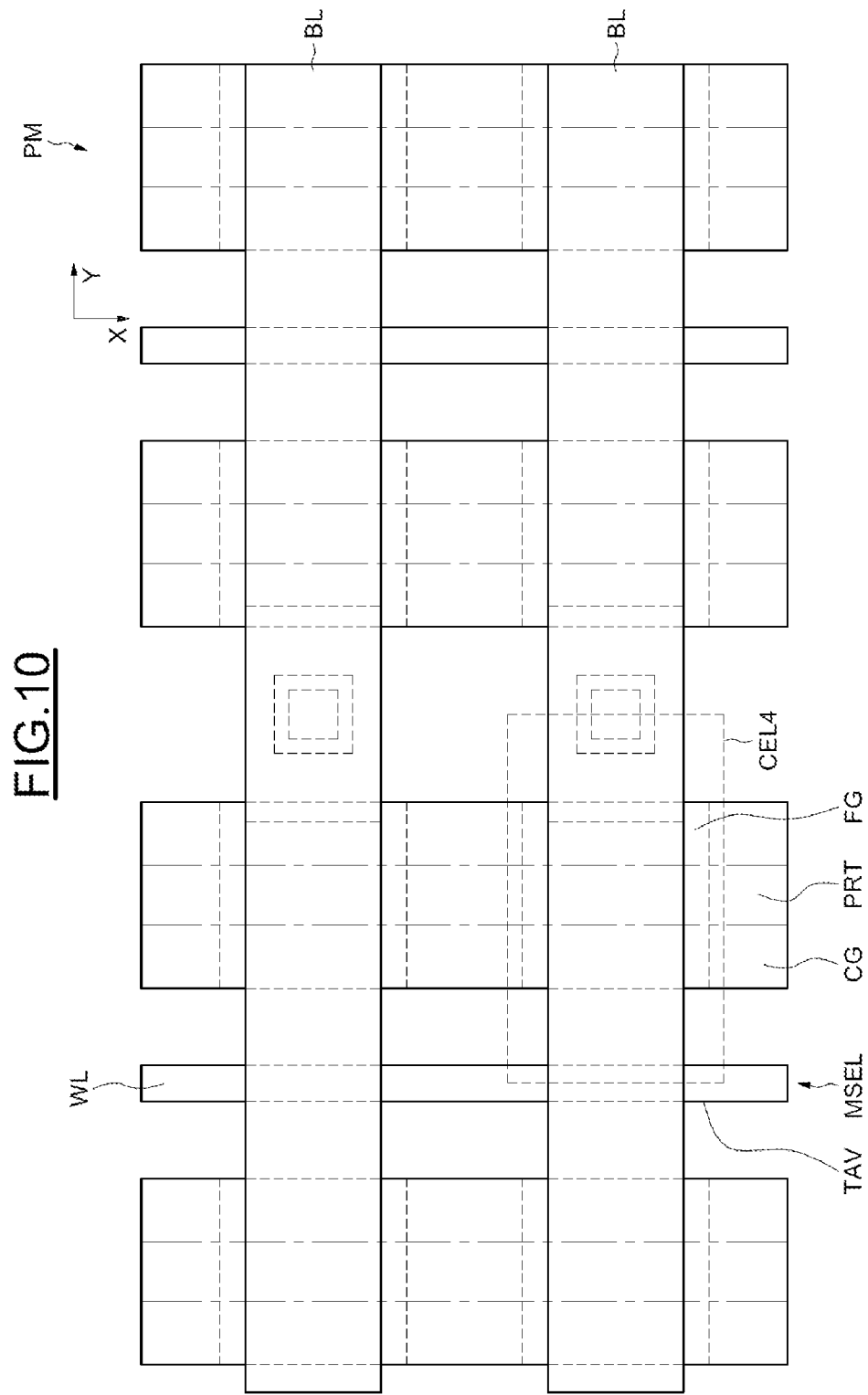

FIGS. 8, 9 and 10 respectively show a circuit diagram, a cross-sectional view and a top view of a memory cell CEL4 according to another embodiment of an EEPROM memory.

The memory cell CEL4 also comprises an access transistor TAV and a state transistor TE, the state transistor comprising a source region S and a drain region D, which regions are formed in a p-type semiconductor substrate PSUB.

The access transistor TAV is a vertical-gate MOS transistor and forms a selection structure MSEL.

The state transistors TE and the access transistor TAV, and more particularly their active zones, are located in a top portion PISO of the semiconductor substrate, which portion is separated from the rest of the substrate PSUB by a buried semiconductor layer NISO.

The buried layer NISO is n$^+$-type and also forms the source line SL and the source region of the access transistor TAV.

The drain region of the access transistor TAV is common to the source region S of the state transistor TE.

The transistor TAV includes a vertical gate GV, which is insulated from the substrate PSUB, the buried layer NISO and the drain region by a gate oxide OXV.

The vertical access transistor TAV may for example be produced by etching a trench, oxidizing the walls of the trench and filling it with polysilicon, or as a variant a metal.

In this embodiment, a memory cell CEL4 stores one bit, and the area occupied by such a memory cell may be 0.16 $\mu m^2$.

FIG. 11 shows three tables indicating the various values taken by the various signals in the memory-plane erasing, programming and reading-out operations implemented by the controller, for the embodiments described with reference to FIGS. 6 to 8.

In these tables the case where a column is selected or not selected in combination with the case where a row is selected or not selected may be seen for each possible logic value (0 or 1) of a datum to be programmed or read-out.

In these tables, the column BL designates the voltage on the bit line BL, the column WL designates the voltage present on a word line, i.e., on the gate of an access transistor TA, the column CG designates the voltage present on the control gate CG of a state transistor TE, the column PSUB designates the voltage of the substrate PSUB or PISO, the column SL designates the voltage applied to the source line SL and the column BL-CG designates the potential difference, or voltage, between the control gate and the drain of the state transistor.

Moreover, the "result" column indicates the concrete effect of the value of the BL-CG voltage and in particular whether there is for example "no disturbance" of neighboring memory cells or "fewer disturbances".

A Fowler-Nordheim current that is large enough to change the threshold voltage of the state transistor is generated when the voltage between the control gate and the zone of the substrate in the tunnel injection zone reaches about 10 V.

Furthermore, if the voltage applied to the control gate CG is positive, then the injection of charge via the Fowler-Nordheim effect into the floating gate may be controlled via the bit line BL only when the conditions are such that a conduction channel actually forms in the channel region.

A positive voltage higher than 5 V between the control gate and the potential of the substrate may be considered to be sufficient to create, whatever the state (programmed or erased) of the memory cell, a channel in the state transistor so that the potential of the substrate zone under the injection zone becomes substantially equal to that of the bit line.

A positive voltage lower than 5 V will possibly, by coupling of the floating gate FG and because of the thinness of the tunnel oxide OXTN, be enough to invert the channel region of the tunnel injection zone, without however forming a conduction channel right across the length of the channel region.

Thus, the on or off state of the state transistor is controlled by the zones of the channel region located under the high-voltage gate oxides OXHV.

Furthermore, as regards the reading-out operation, Vdd designates a voltage value that turns on an access transistor TA, CGread designates the read-out voltage applied to the control gate CG of a state transistor TE and Vhigh designates the voltage value present on the bit line BL during the read-out of a logic "0" from all the memory cells of the memory word.

The read-out is carried out in the conventional way as is usual in the art.

During an operation of erasing a memory cell the row and column of which have been selected, a negative erasing voltage (−13 V) is applied to the control gates CG of the state transistors of the memory cells of a given memory word.

The voltage on the bit line BL is zero, and the potential PSUB of the substrate is also zero. Generally the substrate is connected to ground.

No conductive channel forms under these conditions and therefore, with CG at −13 V, the channel region is in accumulation and at ground because all the substrate PSUB is at ground, and hence charge is extracted from the floating gate FG to the channel region. This results in a positive charge forming on the floating gate FG.

This for example corresponds to the writing of a logic "0" to all the memory cells of the memory word.

In other words, at the end of an erasing step, all the memory cells of the memory word have been turned on.

During an operation of programming a memory cell the row and column of which have been selected a positive programming voltage (+13 V) is applied to the control gates CG of the state transistors of the memory cells of a given memory word.

The potential PSUB of the substrate is zero and therefore the voltage CG is high enough for a conductive channel to be formed in the channel region.

The access transistor is turned off (WL=0) and thus isolates the state transistor TE from the source line SL, the voltage of which is zero.

Therefore, the voltage present in the channel is substantially equal to the voltage present on the drain D of the state transistor TE, i.e., the voltage BL.

If the voltage BL is zero, then BL-CG is −13 V and causes charge to be injected into the floating gate FG. This results in a negative charge forming on the floating gate FG.

This for example corresponds to the writing of a logic "1".

If the voltage BL is at an inhibiting voltage, for example 7 V, then BL-CG is −6 V; this is not enough to inject charge into the floating gate FG and the memory cell remains erased.

Thus, in this implementation, provision is made to prevent the write operation, which is applied collectively to a word and for example corresponds to storage of the logic datum "0", from writing to a cell by virtue of an inhibiting voltage applied selectively to the bit line BL.

The memory cells to which, for example, the logic datum "1" must be written are not inhibited and are collectively programmed.

Moreover, to implement the erasing, programming and reading-out operations of the embodiment described with reference to FIGS. 3 to 6, the voltage on the source line SL during the programming of a selected memory cell is equal to the voltage BL, and the same other signals are applied by the controller.

In other words, during a programming step, certain memory cells are selected and all those memory cells of the memory word which are not selected are turned off.

In summary, the programming step comprises: applying a positive programming voltage to the control gates of the state transistors of the memory cells, the programming voltage being high-enough to invert the channel region of the state transistors; applying a zero voltage to the channel regions of the state transistors of memory cells that are not selected; and applying a positive inhibiting voltage that is lower than the programming voltage to the channel regions of the state transistors of selected memory cells.

In addition to having a significant compactness and a higher coupling factor and enabling more effective extractions-injections, the structure of the floating gate of the embodiments described above allows, with unchanged write times and memory cells of small size, lower voltages to be applied. This structure furthermore allows hot-carrier and band-to-band leakage and the problems that result therefrom, such as excess power consumption, disturbance propagation or problems with data retention, to be avoided.

Figure 12:
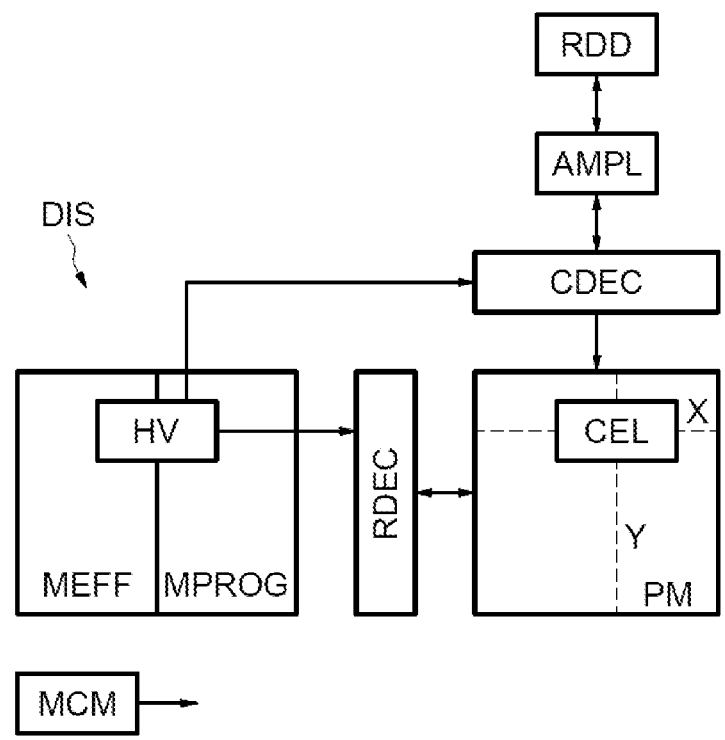

FIG. 12 shows a EEPROM memory device DIS comprising a memory plane PM arranged in a matrix array of rows and columns of memory cells CEL.

This device DIS furthermore includes erasing circuitry MEFF and programming circuitry MPROG, which are configured to implement the various erasing, programming and reading-out operations detailed above, row decoders RDEC and column decoders CDEC and read out the circuitry such as read amplifiers AMPL connected to a data register RDD.

The programming circuitry MPROG and erase circuitry MEFF especially include circuitry HV that allows the programming and erasing pulses to be applied.

The device DIS also comprises controller MCM, for example, including logic circuitry of conventional structure capable of activating the various programming, erase and read out circuits MPROG, MEFF, AMPL.

Other conventional circuits present in the memory device DIS and not indispensable to the comprehension of the invention, such as for example the address shift register, have intentionally not been shown in FIG. 12 for the sake of simplicity.

What is claimed is:

1. An electrically erasable and programmable nonvolatile memory device comprising a memory cell, the memory cell comprising:
a source region disposed in a semiconductor body;
a drain region disposed in the semiconductor body;
a channel region disposed in the semiconductor body between the source region and the drain region;
a control gate; and
a floating gate disposed between the semiconductor body and the control gate, wherein the floating gate includes a protruding portion that is located over the channel region between the source and drain regions and spaced therefrom, the protruding portion being separated from the channel region by a first insulating layer that is thinner than a second insulating layer that separates remaining portions of the floating gate from the channel region, and wherein the control gate includes a lateral portion that extends beyond lateral ends of the floating gate and is vertically aligned with a portion of the channel region.

2. The device according to claim 1, wherein the protruding portion is substantially centered in the middle of the channel region and is laterally insulated from the source and drain regions by the second insulating layer.

3. The device according to claim 1, wherein the memory device comprises:
a memory plane that includes the memory cell and a plurality of additional memory cells arranged in a matrix array of rows and columns, the rows being divided into memory words of a plurality of memory cells; and
an erase circuit that is configured to erase a memory word by way of a collective erasing operation that turns on all the memory cells of the memory word.

4. The device according to claim 3, wherein the additional memory cells each have the same structure as the memory cell and wherein the erase circuit is configured to apply a negative erasing pulse to the control gates of the of the memory cells of the memory word and a zero voltage to the channel region of the memory cells of the memory word.

5. The device according to claim 3, wherein the memory device further comprises a programming circuit configured to program the memory word by applying a programming pulse to the control gates of all the memory cells of the memory word, while inhibiting the programming of those memory cells of the memory word that is not to be programmed.

6. The device according to claim 5, wherein the programming circuit is configured to apply, by way of programming pulse, a positive voltage that is sufficient to invert the channel regions of the memory cells, to apply a zero voltage to the channel regions of the memory cells to be programmed, and to apply an inhibiting voltage that is positive and lower than the positive voltage via the drain region of the memory cells that are not to be programmed.

7. The device according to claim 1, wherein the memory cell includes a selection structure configured to electrically isolate from, or connect to, a source line of the memory device that is associated with the source region of the memory cell.

8. The device according to claim 7, wherein the selection structure comprises the lateral portion of the control gate.

9. The device according to claim 8, further comprising:
a memory plane that includes the memory cell and a plurality of additional memory cells arranged in a matrix array of rows and columns, wherein
the additional memory cells each have the same structure as the memory cell, the memory plane including two connected memory cells to which a logic datum can be written,
the source regions of the two connected memory cells are electrically connected to each other by a source metal track,
the drain regions of the memory cells are electrically connected to each other by a drain metal track,
the source line comprises a metal track extending in a direction of the columns of the memory plane over one of two connected memory cells,
the source line is connected, above the source region of the one of two connected memory cells, by a via to the source metal track, and
a bit line comprising a metal track extends in the direction of the columns of the memory plane above the other of the two connected memory cells and is connected, above the drain region of the other of the two connected memory cells, by a via to the drain metal track.

10. The device according to claim 1, wherein the memory cell further comprises:
a third insulating layer between the lateral portion of the control gate and the semiconductor body, wherein the third insulating layer is the same thickness as the second insulating layer.

11. The device according to claim 1, wherein
a vertical thickness of the first insulating layer is about 7.5 nm,
a vertical thickness of the second insulating layer is about 22 nm, and
a vertical thickness of the floating gate is about 100 nm.

12. The device according to claim 1, wherein the protruding portion of the floating gate has a width measured in a source-drain direction, and the floating gate has a width measured in the source-drain direction, wherein, to within 10%, the width of the protruding portion is one quarter of the width of the floating gate.

13. A method for writing logic data in a nonvolatile memory device that includes a memory plane arranged in a matrix array of rows and columns of memory cells, the rows being divided into memory words of a plurality of memory cells, the method comprising:
performing an erasing step for a first memory word, wherein all memory cells of the first memory word are turned on during the erasing step; and
performing a programming step for a second memory word, wherein memory cells of the second memory word not to be programmed are selected and memory cells of the memory word to be programmed are turned off, so that the memory cells of the memory word to be programmed are programmed in the memory cells of the second memory word not to be programmed are not programmed;
wherein each of the memory cells of the memory plane comprises
a source region and a drain region disposed in a semiconductor body,
a channel region disposed in the semiconductor body between the source region and the drain region,
a control gate, and
a floating gate disposed between the semiconductor body and the control gate;
wherein the floating gate includes a protruding portion that is located over the channel region between the source and drain regions and spaced therefrom, the protruding portion being separated from the channel region by a first insulating layer that is thinner than a second insulating layer that separates remaining portions of the floating gate from the channel region; and wherein the control gate includes a lateral portion that extends beyond lateral ends of the floating gate and is vertically aligned with a portion of the channel region.

14. A memory cell comprising:
a source region disposed in a semiconductor body;
a drain region disposed in the semiconductor body and spaced from the source region in a source-drain direction by an intermediate region, the intermediate region being homogeneous along a top surface of the semiconductor body extending from the source region to the drain region;
a first insulating region overlying a middle portion of the intermediate region that is spaced from both the source region and the drain region along the source-drain direction;
a second insulating region having a first portion overlying the intermediate region between the middle portion of the intermediate region and the source region and having a second portion overlying the intermediate region between the middle portion of the intermediate region and the drain region, wherein
 the first portion extends along the source-drain direction from the middle portion to the source region,
 the second portion extends along the source-drain direction from the middle portion to the drain region, and
 the second insulating region is thicker than the first insulating region;
a floating gate having a protruding portion that overlies the first insulating region, a first laterally extending portion that overlies the second insulating region in a direction of the source region, and a second laterally extending portion that overlies the second insulating region in a direction of the drain region; and
a control gate overlying the floating gate.

15. The memory cell according to claim 14, wherein the floating gate is laterally spaced from both the source region and the drain region and wherein the control gate extends beyond edges of the floating gate in the source-drain direction.

16. The memory cell according to claim 15, wherein portions of the control gate that extend beyond the edges of the floating gate in the source-drain direction form a selection structure that is configured to electrically isolate or electrically connect the source region and remaining portions of the memory cell.

17. The memory cell according to claim 14, further comprises a selection transistor that is laterally spaced from the floating gate and control gate.

18. The memory cell according to claim 17, wherein the selection transistor comprises a planar MOS transistor.

19. The memory cell according to claim 18, wherein the selection transistor comprises a control gate overlying and electrically connected to a floating gate.

20. The memory cell according to claim 17, wherein the selection transistor comprises a vertical MOS transistor extending from the source region into the semiconductor body.

21. The memory cell according to claim 14, wherein the protruding portion is substantially centered between the source region and the drain region.

22. The memory cell according to claim 21, wherein the floating gate and the control gate are substantially symmetric around a line that is perpendicular to the source-drain direction and extends through a center of the protruding portion in the source-drain direction.

23. The memory cell according to claim 14, further comprising a second floating gate overlying the semiconductor body and spaced from the floating gate in a direction perpendicular to the source-drain direction, the control gate overlying the second floating gate, wherein the second floating gate comprises a protruding portion that overlies an insulating layer having the same thickness as the first insulating region, a first laterally extending portion that overlies the second insulating region in the direction of the source region, and a second laterally extending portion that overlies the second insulating region in the direction of the drain region, the second floating gate being laterally spaced from both the source region and the drain region.

24. The memory cell according to claim 14, wherein the protruding portion of the floating gate has a width measured in a source-drain direction, and the floating gate has a width measured in the source-drain direction, wherein, to within 10%, the width of the protruding portion is one quarter of the width of the floating gate.

* * * * *